United States Patent [19]
Desperques-Volmier

[11] 3,908,136
[45] Sept. 23, 1975

[54] ANALOGUE GATES

[75] Inventor: Serge Desperques-Volmier, Paris, France

[73] Assignee: Thomson-CSF, Paris, France

[22] Filed: May 2, 1974

[21] Appl. No.: 466,471

[30] Foreign Application Priority Data
May 8, 1973 France .............................. 73.16511

[52] U.S. Cl. .................................. 307/251; 307/304
[51] Int. Cl.[2] .......................................... H03K 17/60
[58] Field of Search ........... 307/246, 251, 300, 304; 328/151

[56] References Cited
UNITED STATES PATENTS 3,586,880 6/1971 Fitzwater ........................ 307/251 X Primary Examiner—James B. Mullins
Attorney, Agent, or Firm—Cushman, Darby & Cushman

[57] ABSTRACT

An analogue gate with a short response time comprises a field-effect transistor whose source or drain is connected to the input, the other electrode to the output. It is triggered from the blocking to the conducting state by a follower which places the gate voltage at the same level as the source voltage and is blocked by means which establish a conductive path from the gate to a suitable voltage source.

6 Claims, 3 Drawing Figures

ANALOGUE GATES

The present invention relates to an analogue gate, that is to say an electrical circuit with an input and an output and an electronic control element. The application to this control element of a voltage that can adopt two logic levels referred to as 0 and 1, enables said circuit to be given either a substantially 0 impedance (output voltage equals the input voltage) or a very high impedance (output voltage 0), the input voltage varying continuously between two given extreme values.

It is well known to manufacture circuits of this kind by means of field-effect transistors, these transistors being rendered conductive or being blocked, by the application of an appropriate voltage to their control gate. The main drawback of these circuits is that they have a substantial response time. As a matter of fact, the gate does not generally have any conductive path for evacuating the charges of the gate-drain capacitance, when the element is triggered from the conductive state to the blocked state.

The object of the present invention is an analogue gate comprising a field-effect transistor which is free of these drawbacks.

The analogue gate in accordance with the invention comprises a first field-effect transistor, having a source receiving the input voltage, a drain supplying the output voltage and a gate, a switch, having one output connected to said transistor gate, a first input connected to a fixed potential capable of blocking said transistor, and a second input; a voltage follower, having an input connected to said drain, an output connected to said second switch input; said switch having a control input for switching at will, said two switch inputs to said switch output.

The present invention will be better understood from a consideration of the following description and by reference to the attached drawings in which.

Figure 1:
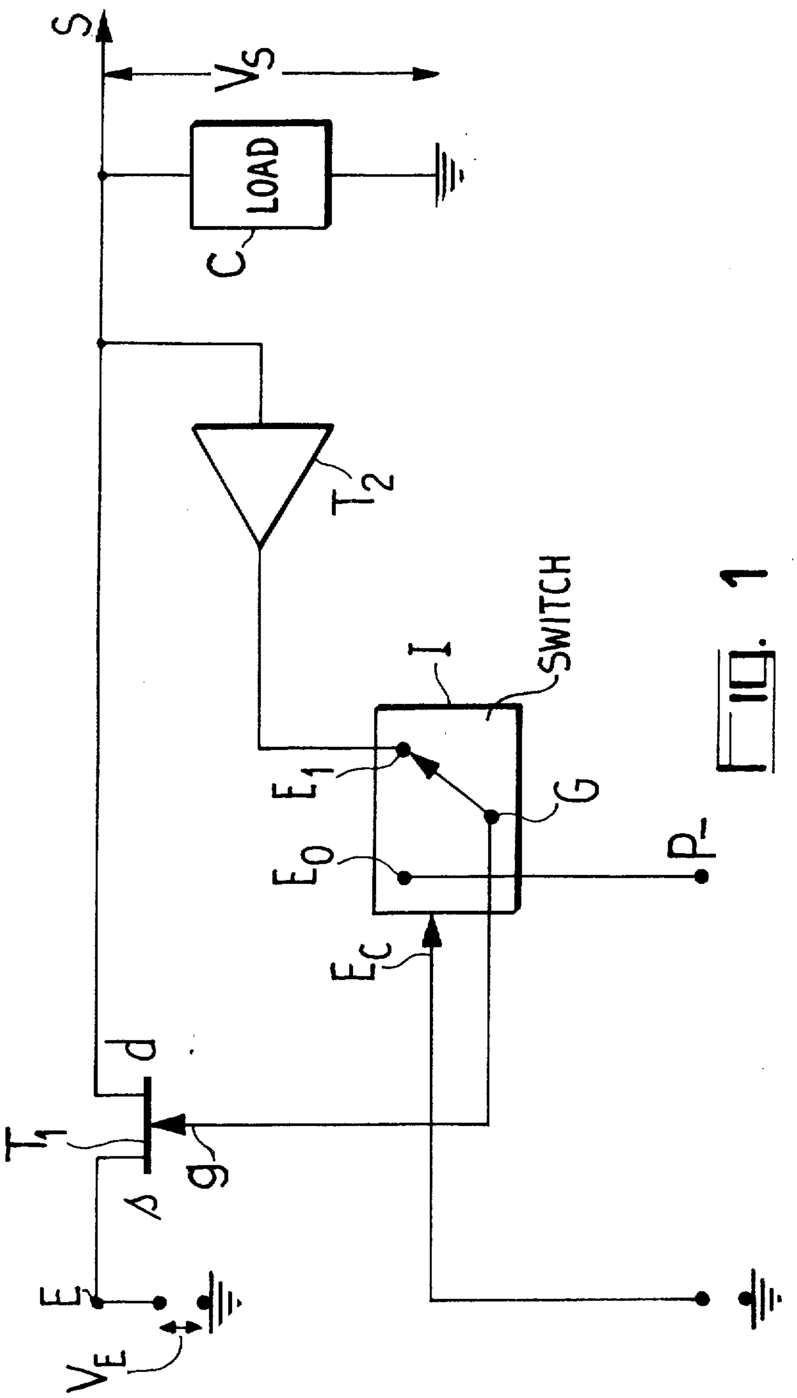
FIG. 1 illustrates a block circuit diagram of the device in accordance with the invention.

In FIG. 1, the field-effect transistor $T_1$ which is the main element of the analogue gate, has its source connected to the input terminal $V_E$ of the device. To this input terminal is applied a voltage which varies continuously between two predetermined values, for example −2 volts and +2 volts. Its drain is connected to the output terminal S which is in turn earthed across a load C. Its drain is connected on the other hand to the input of the voltage-follower $T_2$ whose output reconstitutes the voltage at S, thus operates as an impedancematching device having a high input impedance and a low output impedance.

The output of the follower is connected to an input $E_1$ of a switch I whose other input $E_0$ is connected to the negative pole P of a voltage source, which when applied to the gate of the transistor, is capable of blocking the transistor $T_1$. The switch I has a control input $E_c$ supplied with a two-level voltage which respectively places it in two states respectively indicated by 0 and 1.

In the 0 state, the input $E_0$ of the switch is connected to the output G, whilst in the 1 state, the input $E_1$ of the switch is connected to the output G.

The operation of the system is as follows:

a. state 1: the input $E_1$ is connected to the gate of the transistor $T_1$. The result is that this gate is at the drain potential of the same transistor. Whatever the type of transistor involved, provided that its conduction channel exists at a potential difference of Vds = 0 (transistor of the depletion type), the transistor will be conductive and $V_S = V_E$.

b. state 0: the output G is connected to the input $E_0$, and the gate is connected to the bias source P whose potential is chosen, in terms of polarity and amplitude, to be sufficiently high in order to block the transistor. When transistor is triggered from the conductive state to the blocked state, the gate-drain capacitance of the transistor discharges across the circuit comprising the amplifier $T_2$, the switch G and the ground. Transistors currently being manufactured by microelectronic techniques, have a gate-drain capacitance which is sufficiently low for their charging and discharging time to be neglected, whatever the resistance across which said charging or discharging takes place.

Figure 2:
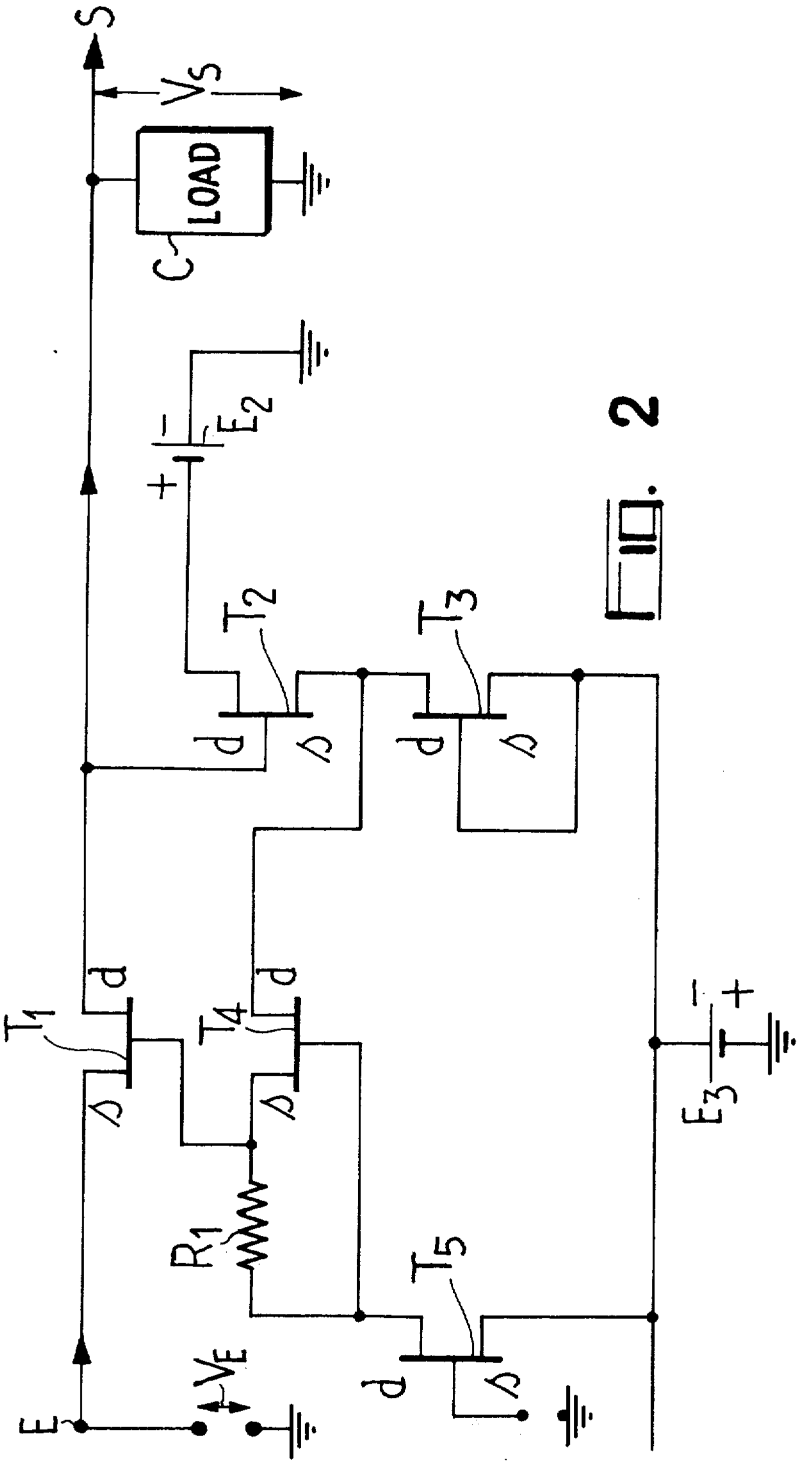
FIG. 2 illustrates an example of the invention.

FIG. 2 illustrates an embodiment of the device shown in FIG. 1. In this figure, similar references designate similar elements to those shown in FIG. 1; all the field-effect transistors have an N-type channel and are of the depletion type. This circuit can be integrated. The amplifier-follower is a field-effect transistor $T_2$ whose gate is connected to the drain of the transistor $T_1$, the drain to the positive terminal of a battery $E_2$, the source to the drain of a transistor $T_3$ whose gate and source are interconnected and taken together to the negative terminal of a battery $E_3$. The transistor $T_3$ is therefore conductive at all times and can be considered as a variable resistor.

The source of the transistor $T_2$ also is connected to the drain of a field-effect transistor $T_4$ the source of which is connected to the gate of the transistor $T_1$, the gate to the drain of a transistor $T_5$. The drain of the latter transistor is likewise connected to the gate of the transistor $T_1$ across a resistor $R_1$. Its source is connected to negative terminal of the battery $E_3$. Its gate is supplied with a two-level control voltage, one of said levels blocking the transistor $T_5$ and the other driving it conductive.

As outlined hereinabove, in this non-limitative example, all the transistors of the depletion type have N-type channels. The input voltage varies between −2 volts and +2 volts. The battery $E_2$ supplies 6 volts, the battery $E_3$ − 6 volts. The voltage levels applied to the gate of the transistor $T_5$ are respectively −6 volts (level 1) and −8 volts (level 0).

The transistor $T_5$ is therefore conductive when its gate is at level 1 (Vgs = 0) and is designed for being blocked when its gate is at the level 0 (Vgs = −2 volts).

Operation of the system is as follows:

a. the transistor $T_5$ is blocked (level 0). No current flows across the resistor $R_1$ and the potential difference Vgs on the transistor $T_4$ is 0. The latter transistor is therefore conductive. The transistor $T_2$ being designed to follow the voltage $V_S$, its source potential is substantially equal to the source potential of the transistor $T_4$. This voltage is applied to the gate of the transistor $T_1$ through the medium of the transistor $T_4$, so that the transistor $T_1$ is conductive. The voltage $V_S$ is therefore substantially equal to the input voltage $V_E$.

b. the transistor $T_5$ is conductive. The drain voltage $V_d$ of said transistor is therefore around − 6 volts.

A current flows across the resistor $R_1$ and this has the effect of producing a positive potential difference between the gate of the transistor $T_4$ (potential substantially equal to −6 volts) and the source of said transistor, which potential is equal to (−6 volts $+R_1$ i), i being the current flowing through the resistor.

The transistor therefore tends to block although it retains a certain level of conductivity. The gate of the transistor $T_1$ is at a potential of −6 volts $+R_1$ i, that is to say in the order of −4 volts.

Its source voltage being equal to −2 volts at a minimum, and to +2 volts at a maximum, it is therefore blocked as well.

It should be pointed out that when the transistor $T_1$ is triggered from the state 1 to the state 0, in this arrangement, the gate-drain capacitance of the transistor $T_1$ discharges across the resistor $R_1$ and the transistor $T_5$ which is conductive, the transistor $T_4$ acting as the switch of FIG. 1.

An integrated circuit manufactured using micro components and designed on the basis of the foregoing data, has a response time of some nanoseconds and the absolute value $V_E - V_S$ is less than 40 millivolts, when transistor $T_1$ is conducting.

Figure 3:
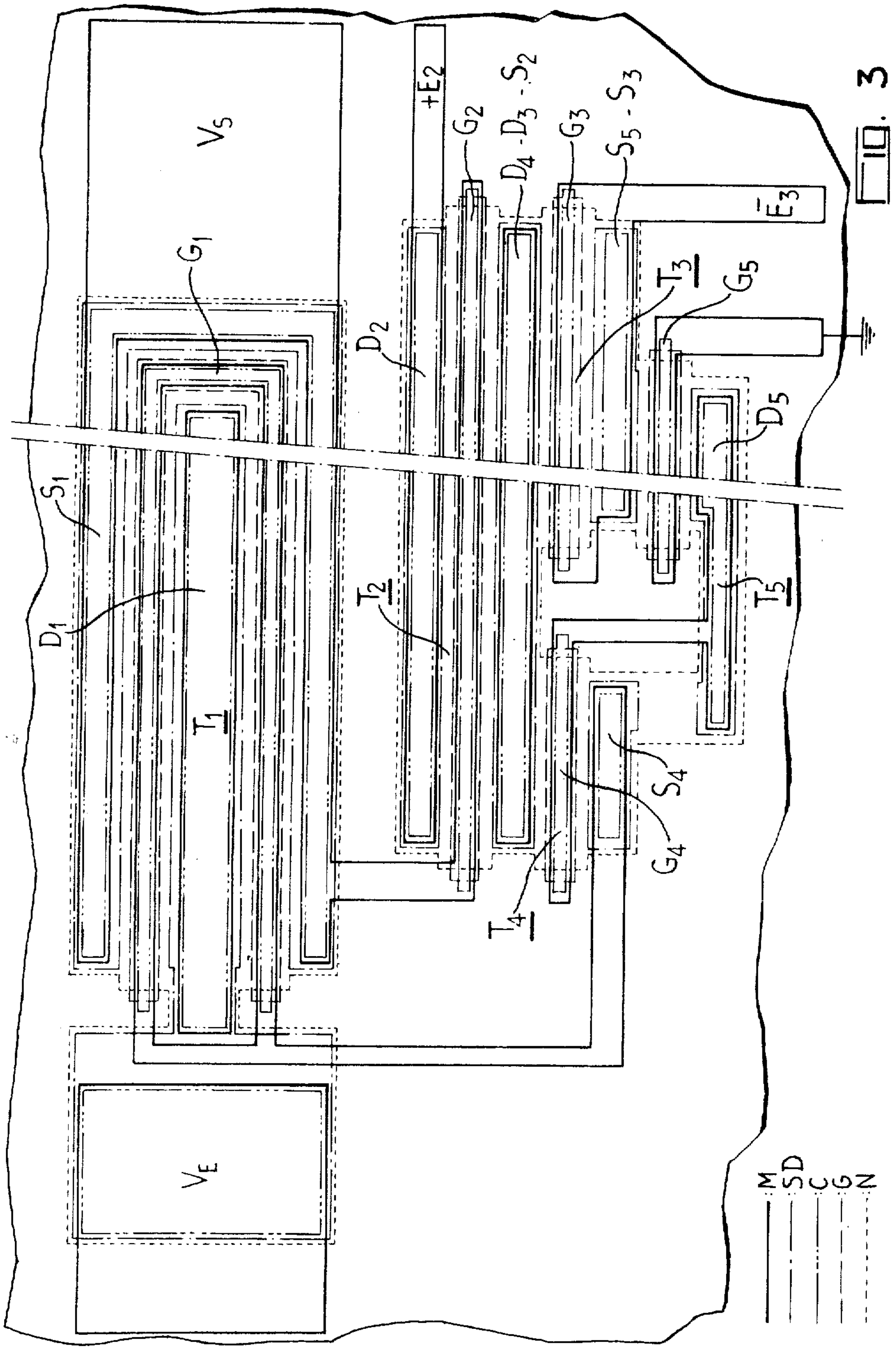
FIG. 3 illustrates the circuit of FIG. 2 formed in integrated fashion on a single substrate.

FIG. 3 illustrates an integrated embodiment of the circuit shown in FIG. 2, the references employed there designating similar elements to those they designated previously, the substrate being of P+ type, the channels being of N-type and the sources and drains of N+ type. The ohmic contacts are of N+ type. Sources, gates and drains of each transistor have an index indicating which transistor is involved. The transistor $T_1$, whose source $S_1$, gate $G_1$ and drain $D_1$ can be seen, is U-shaped.

The full lines illustrate the contours of the metallised areas; the chain dotted lines indicate the contours of the sources and drains (N+ doped zones), whilst the broken lines indicate the gate contours (P+ doped zones), the channels extending beneath the gates being illustrated by sets of dashes separated by three dots. The dashes illustrate the contours of the N doped zones deposited by epitaxy upon the substrate which is of P type. In the illustration, drain and source of the transistor $T_1$ have been reversed. The drain $D_1$ extends beneath a metallised area acting as a contact and supplied with the voltage $V_E$. The source $S_1$ extends beneath a metallised area which furnishes the voltage $V_S$. The gate $G_2$ is connected to the source $S_1$. The electrodes $D_4$, $D_3$ and $D_2$ are formed in one and the same diffusion operation, as also are the sources $S_3$ and $S_5$. The gate $G_5$ and the source $S_3$ are connected by the same metallised area. The resistor $R_1$ is an N-doped zone. In the figure, the letters M, SD, C, G and N designate respectively the metallised areas (M), the sources (S) and drains (D), the channels (C), the gates (G) and the layers (N).

What I claim is:

1. An analogue gate comprising a first field-effect transistor, having a source receiving the input voltage, a drain supplying the output voltage and a gate, a switch, having one output connected to said transistor gate, a first input connected to a fixed potential capable of blocking said transistor, and a second input; a voltage follower, having an input connected to said drain, an output connected to said second switch input; said switch having a control input, for switching at will, said two switch inputs to said switch output.

2. A gate as claimed in claim 1 wherein said switch comprises a second transistor, having a source at a fixed potential, a drain and a gate for receiving a two-level voltage for blocking or unblocking said transistor, a third transistor having a source, a gate and a drain connected to said voltage follower output, said third transistor gate being connected to said second transistor drain, a resistor interconnecting said second transistor drain and said third transistor source.

3. A gate as claimed in claim 2, wherein said voltage follower comprises a fourth transistor having a drain connected to another fixed potential of a polarity opposite to said fixed potential, a gate connected to said first transistor drain, and a source connected to said third transistor drain, and a further resistor for connecting said fourth transistor source to said fixed potential.

4. A gate as claimed in claim 3, wherein said further resistor comprises, a fifth transistor, having a drain connected to said fourth transistor source and a gate and a source interconnected to said fixed potential.

5. A gate as claimed in claim 4, wherein said transistors are of the depletion type and have N-type channels.

6. A gate as claimed in claim 1 having components integrated upon the same substrate.

* * * * *